(12) United States Patent
Wang et al.

(10) Patent No.: US 8,610,462 B1
(45) Date of Patent: Dec. 17, 2013

(54) INPUT-OUTPUT CIRCUIT AND METHOD OF IMPROVING INPUT-OUTPUT SIGNALS

(75) Inventors: Xiaobao Wang, Cupertino, CA (US); Chiakang Sung, Milpitas, CA (US); Khai Nguyen, San Jose, CA (US); Bonnie I. Wang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/332,730

(22) Filed: Dec. 21, 2011

(51) Int. Cl.
| H03K 19/094 | (2006.01) |
| H03K 19/0175 | (2006.01) |
| H03K 3/00 | (2006.01) |
| H03B 1/00 | (2006.01) |

(52) U.S. Cl.
USPC .............................. 326/68; 326/82; 327/108

(58) Field of Classification Search
USPC ............... 326/68, 82, 83; 327/108, 109, 333
See application file for complete search history.

(56) References Cited

U.S. PATENT DOCUMENTS

| 6,246,270 | B1 | 6/2001 | Wang et al. | |
| 7,026,847 | B2 | 4/2006 | Wang et al. | |
| 7,053,656 | B2 * | 5/2006 | Seo | 326/68 |
| 7,180,329 | B1 | 2/2007 | Sia et al. | |
| 7,193,443 | B1 | 3/2007 | Smith et al. | |
| 7,609,090 | B2 * | 10/2009 | Srivastava et al. | 326/80 |
| 7,626,440 | B1 | 12/2009 | Atesoglu | |
| 7,705,631 | B2 * | 4/2010 | Chen | 326/81 |
| 7,710,151 | B2 * | 5/2010 | Hung et al. | 326/80 |
| 7,710,183 | B2 * | 5/2010 | Chaba et al. | 327/333 |
| 7,994,821 | B1 * | 8/2011 | Wang et al. | 326/81 |
| 8,169,234 | B1 * | 5/2012 | Bourstein | 326/81 |
| 2008/0074148 | A1 * | 3/2008 | Srivastava et al. | 326/68 |

OTHER PUBLICATIONS

Liu et al., U.S. Appl. No. 11/521,790, filed Sep. 15, 2006.

* cited by examiner

*Primary Examiner* — Shawki Ismail
*Assistant Examiner* — Dylan White
(74) *Attorney, Agent, or Firm* — Treyz Law Group; David C. Kellogg

(57) ABSTRACT

Circuits and techniques for operating an integrated circuit (IC) with a level shifter circuit are disclosed. A level shifter circuit with input and output terminals is operable to shift an input signal that ranges from a ground voltage to a first positive voltage to an output signal that ranges from the ground voltage to a second positive voltage. The level shifter circuit further includes a first kicker transistor having a first source-drain terminal operable to receive a buffered version of the input signal and having a second source-drain terminal coupled to the output terminal. The first kicker transistor may receive gate signals that turn on the first kicker transistor when the input signal is at the ground voltage and may pull the output terminal to the first positive voltage as the input signal transitions from the ground voltage to the first positive voltage.

22 Claims, 5 Drawing Sheets

INPUT-OUTPUT CIRCUIT AND METHOD OF IMPROVING INPUT-OUTPUT SIGNALS

BACKGROUND

Integrated circuits (ICs) are used in various applications and devices. Programmable circuits, which may be found in field-programmable gate array (FPGA) devices, may include logic blocks, generic structures, and input-output structures that can be configured to perform a variety of functions and support a variety of different protocols. These circuits may include embedded memory blocks that are operable to cater for different design requirements. Programmable circuits as well as other types of ICs generally include input-output (I/O) circuits that can be used to support multiple I/O protocols, including different memory interfaces.

Generally, the speed of the device varies depending on which memory interfaces are used and the particular design implemented. For instance, the data rate of a double data rate type three (DDR3) interface may go up to 3.2 Gbps. Memory blocks in a programmable circuit are generally embedded in a core region of the programmable circuit and signals to and from the embedded memory blocks travel through I/O circuitry that are generally placed on the perimeter of the programmable circuit. The core region of the programmable circuit and the I/O circuitry typically operate in different power domains.

For instance, the core region of the programmable circuit may operate at 0.85v while the I/O circuitry around the core region may operate at a higher voltage for different interfaces, e.g., 1.5v for the DDR3 interface. As such, a level shifter circuit, i.e., a circuit that connects one circuit that uses one logic level or power level to another circuit that uses another logic level or power level, is usually placed between the I/O circuits and the embedded memory blocks in the core region of the programmable circuit.

However, conventional level shifter circuits, which are typically latch-type circuits, need to overcome their previous state when switching from one state to another state. Therefore, compared to other logic elements, such as inverters, gates, etc., level shifter circuits usually operate at a lower speed and create bottlenecks that slow down memory interfaces.

SUMMARY

An improved level shifter circuit is provided. Embodiments of the present invention include circuits and techniques for operating an integrated circuit (IC) with an enhanced level shifter circuit that is operable to boost input-output signals.

It is appreciated that the present invention can be implemented in numerous ways, such as a process, an apparatus, a system, a device, or a method on a computer readable medium. Several inventive embodiments of the present invention are described below.

In one embodiment, a level shifter circuit with input and output terminals is disclosed. The level shifter circuit is operable to shift an input signal having a first voltage range to an output signal to an output signal having a second voltage range. The first voltage range may include first positive and ground voltages and the second voltage range may include second positive and ground voltages. The second positive voltage may be greater than the first positive voltage. Alternatively or in addition, the second ground voltage ma be less than the first ground voltage.

The level shifter circuit may include a first kicker circuit with a first source-drain terminal operable to receive a buffered version of the input signal and a second source-drain terminal coupled to the output terminal. The first kicker circuit may be operable to receive gate signals that turn on the first kicker circuit when the input signal is at the first ground voltage and may be operable to kick the output terminal towards the first positive voltage as the input signal transitions from the first ground voltage to the first positive voltage. Alternatively or in addition, the level shifter circuit may include a second kicker circuit with a first source-drain terminal operable to receive an inverted version of the input signal and a second source-drain terminal coupled to an inverted version of the output terminal. The second kicker circuit may be operable to receive gate signals that turn on the second kicker circuit when the input signal is at the second ground voltage and may be operable to kick the output terminal, through the inverted output terminal, towards the first ground voltage as the input signal transistors from the first positive terminal to the first ground voltage.

In another embodiment, a circuit is disclosed. The circuit includes a first circuit having an input and an output and a first inverter and a second inverter having a first connection and a second connection to each other. A second circuit with a first transistor is coupled to the first circuit with the gate of the first transistor coupled to the first connection, a first source-drain terminal coupled to the input and a second source-drain terminal coupled to the second connection. The second circuit is operable to enhance a first edge of an output signal at the output when an input signal at the input switches from a first state to a second state.

In yet another embodiment, another circuit is disclosed. The circuit includes an input terminal coupled to receive an input signal at a first logic level and a shifter circuit coupled to receive the input signal. The shifter circuit is operable to shift the input signal from a first voltage range to a second voltage range. The shifter circuit is also operable to transmit the shifted signal to an output terminal. A booster circuit is coupled to the shifter circuit and is coupled to receive the input signal. The booster circuit is operable to improve the shifted signal at the output terminal when the input signal transitions from the first logic level to a second logic level. Additionally or alternatively, the booster circuit is operable to improve the shifted signal at the output terminal when the input signal transitions from the second logic level to the first logic level.

Other aspects of the exemplary embodiments will become apparent from the following detailed description, taken in conjunction with the accompanying drawings, illustrating by way of example the principles of the embodiments.

DETAILED DESCRIPTION

The following embodiments describe circuits and techniques for operating an integrated circuit (IC).

It will be obvious, however, to one skilled in the art, that the present exemplary embodiments may be practiced without some or all of these specific details. In other instances, well-known operations have not been described in detail in order not to unnecessarily obscure the present embodiments.

Generally, different components, e.g., memory modules, etc., may be coupled to an IC device through input-output ports on the IC device that are operable to support a variety of different interfaces (e.g., a variety of different communications protocols). Input-output buffers on the IC device are operable to receive signals from external components connected to the IC device and transmit signals originating from the IC device to the external components connected to the IC device. If the IC device is coupled to a high-speed memory module, e.g., DDR3 memory module, the IC device may communicate with the high-speed memory module through a high-speed memory interface, e.g., a DDR3 memory interface. As the operating speed of devices is increased over time, the speed of the memory interfaces continues to increase and input-output buffers on the IC device need to be able to support the higher data rates provided by the memory interfaces.

However, as the IC device may generally include internal circuitry that operate at a different voltage level than the external components that are coupled to the IC device, a level shifter circuit is generally used to convert signals from the core from one voltage level to another (e.g., from one voltage range to another voltage range) before the signals are transmitted through the input-output buffers on the IC device. It is therefore desirable for the level shifter circuit to be able to operate at substantially the same speed as the input-output buffers. The embodiments described herein provide techniques and circuits to improve the speed of a level shifter circuit on an IC device. One of the embodiments describes a level shifter circuit that includes a kicker circuit that is operable to boost an edge (e.g., a rising edge and/or a falling edge) of a signal from the core of the IC device when the signal is transitioning from one state to another before being transmitted to out of the IC device through input-output buffers on the IC device. The kicker circuit may dynamically control the pull-up and pull-down strengths of the level shifter when the signal is transitioning from one state to another state. With the kicker circuit, the speed of the signal may be increased and the level shifter circuit may be able to operate at a substantially similar speed as the input-output buffers.

Figure 1:
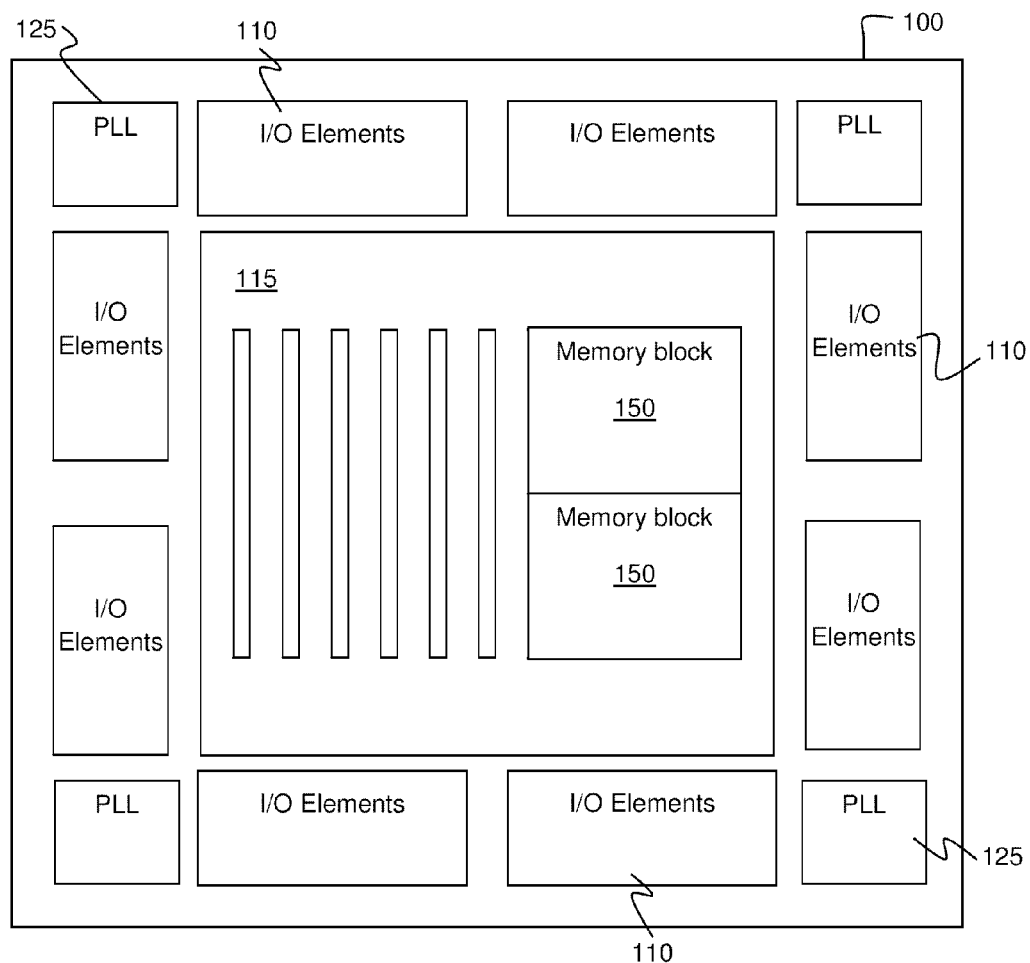
FIG. 1 is a simplified block diagram of an IC in accordance with an embodiment of the present invention.

FIG. 1, meant to be illustrative and not limiting, shows a simplified block diagram of IC 100 that can implement embodiments of the present invention. IC 100 includes core logic region 115 and input-output (I/O) elements 110. Other auxiliary circuits such as phase-locked loops (PLLs) 125 for clock generation and timing, can be located outside the core logic region 115, e.g., at corners of IC 100 and adjacent to I/O elements 110. Core logic region 115 may be populated with logic cells that may include "logic elements" (LEs), among other circuits. LEs may include look-up table-based logic regions and may be grouped into "Logic Array Blocks" (LABs). The LEs and groups of LEs or LABs can be configured to perform logical functions desired by the user. Configuration data loaded into configuration memory can be used to product control signals that configure the LEs and groups of LEs and LABs to perform the desired logical functions. Core logic region 115 may also include a plurality of embedded memory blocks 150 that can be used to perform a variety of functions.

Referring still to FIG. 1, I/O elements 110 may support a variety of interface protocols. I/O elements 110 may support a variety of single-ended and differential I/O standards. I/O elements 110 may also include I/O buffers that connect IC 100 to other external components. Signals from core region 115 are transmitted through I/O elements 110 to external components that may be connected to IC 100. A single device like IC 100 can potentially support a variety of different interfaces and each individual I/O bank 110 can support a different I/O standard with a different interface or a different voltage level. If IC 100 is coupled to an external circuit through a high-speed memory interface, e.g., DDR3, etc., a memory controller circuit may be included in IC 100 to communicate with core region 115 and I/O elements 110 before the signals are transmitted to the external circuit. IC 100 receives signals from external circuitry at I/O elements 110. Core logic region 115 and other logic blocks on IC 100 may perform functions based on the signals received. Signals may be sent from core logic region 115 and other relevant logic blocks of IC 100 to other external circuitry or components that may be connected to IC 100 through I/O elements 110.

Figure 2:
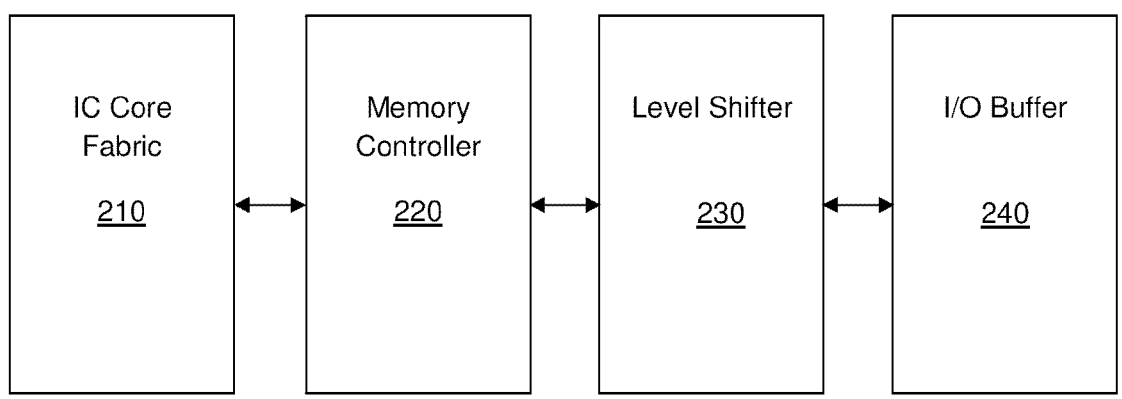
FIG. 2 is a simplified block diagram of circuitry in an integrated circuit in accordance with an embodiment of the present invention.

FIG. 2, meant to be illustrative and not limiting, shows a simplified block diagram of one embodiment in accordance with the present invention. It should be appreciated that the illustrative embodiment of FIG. 2 may be used to implement a memory interface on an IC device that is connected to an off-chip memory module or may be used to implement a data interface on the IC device that is connected to an off-chip module. Even though an IC device, e.g., IC 100 of FIG. 1 may include embedded memory blocks 150, other design requirements, e.g., system bandwidth requirements, etc., may necessitate the use of fast off-chip memory devices. In order for the IC device to communicate with the external memory device, a memory controller may be used to manage the flow of data between the IC device and the memory module.

The embodiment of FIG. 2 includes a core logic block 210, a memory controller block 220, a level shifter block 230 and an I/O buffer block 240. Signals from core logic block 210 are transmitted to memory controller block 220 before being transmitted to level shifter block 230 and finally to I/O buffer block 240. It should be appreciated that core logic block 210 may be a core logic region on an IC device, e.g., core region 115 of FIG. 1 and certain blocks, e.g., memory controller block 220 and I/O buffer block 240, are not described in detail in order to not unnecessarily obscure the present invention.

Referring still to FIG. 2, a level shifter circuit block 230 may be included to convert signals from IC core block 210 from one voltage level to another before being transmitted to any external component, e.g., an off-chip memory module, that may be coupled to the IC device through I/O buffer block 240. This is because, generally, the core logic block 210 of an IC may operate at a different voltage level compared to the voltage level of signals transmitted off-chip and received from off-chip components by I/O buffer block 240. For instance, in one embodiment, IC core logic block 210 may operate with logic high levels at 0.85V while I/O buffer block 240 may operate at logic high levels at 1.5V. Level shifter block 230 may therefore be used to shift or convert voltages from one domain to another domain (e.g., from the domain of IC core logic block 210 to the domain of I/O buffer 240). In some instances, the switching speed of level shifter block 230 may be slower than the speed of the memory interface used (e.g., the memory interface coupled to I/O buffer 240). Therefore, in order to fully support high-speed memory interfaces, level shifter block 230 may include a booster circuit, the details of which will be described with reference to FIGS. 3A and 3B, to improve the switching speed of level shifter block 210 when switching between one logic state and another logic state, according to one embodiment.

Figure 3A:
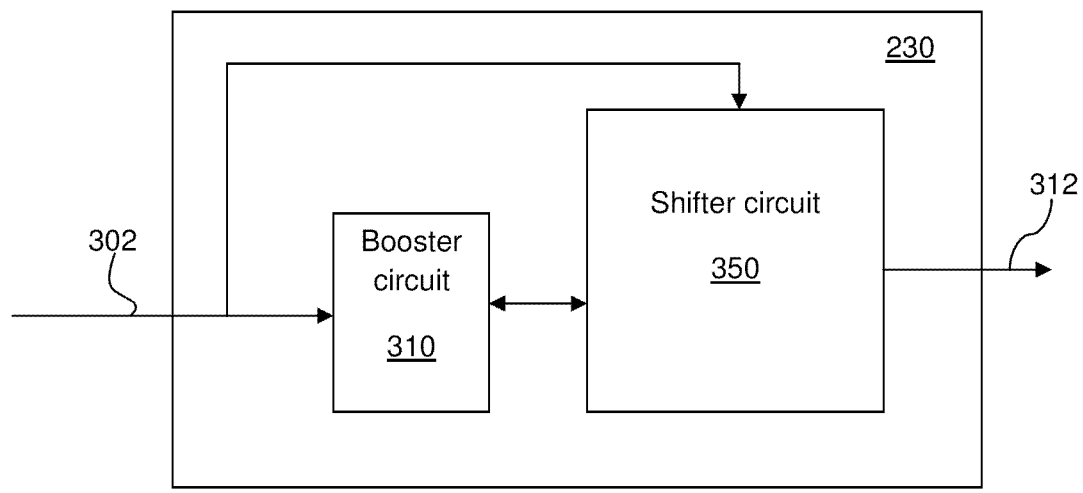
FIG. 3A is a schematic diagram of a booster circuit in a level shifter block in accordance with an embodiment of the present invention.

FIG. 3A, meant to be illustrative and not limiting, shows a booster circuit 310, also referred to herein as a kicker circuit, in level shifter block 230 as one embodiment in accordance with the present invention. Level shifter block 230 includes an input terminal 302 and an output terminal 312. Input signals received at input terminal 302 are transmitted to booster circuit 310 and shifter circuit 350 within level shifter block 230. In one embodiment, depending on the logic level of a previous signal and the logic level of a particular signal received at input terminal 302, booster circuit 310 may be operable to boost the output signal at output terminal 312. For instance, when the signal at input terminal 302 is switching from 0V to 0.85V, booster circuit 310 may boost the output signal at output terminal 312 by pulling the output signal "high" and improving the rising edge of the output signal (relative to arrangements in which booster circuit 310 is not present). In an exemplary embodiment, booster circuit 310 may include a plurality of transistors and shifter circuit 350 may include another plurality of transistors coupled in a cross-coupled configuration.

Figure 3B:
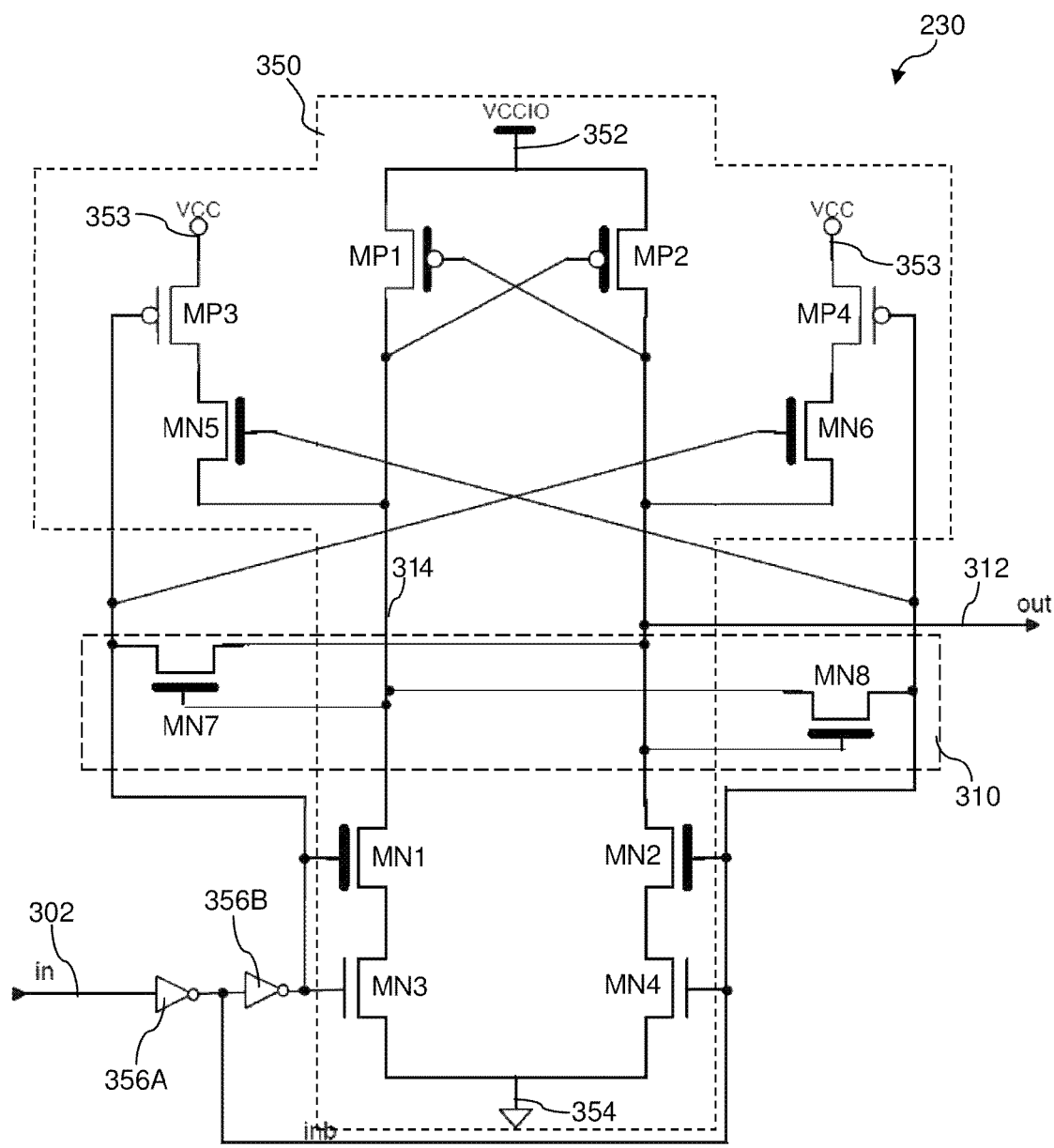
FIG. 3B is a schematic diagram of a booster circuit coupled in a level shifter circuit in accordance with an embodiment of the present invention.

FIG. 3B, meant to be illustrative, shows a more detailed representation of a booster circuit 310 coupled to a shifter circuit 350 as one embodiment in accordance with the present invention. Shifter circuit 350 may include four P-channel metal-oxide-semiconductor field-effect (PMOS) transistors, i.e., MP1, MP2, MP3 and MP4, and six N-channel metal-oxide-semiconductor field-effect (NMOS) transistors, i.e., MN1, MN2, MN3, MN4, MN5 and MN6.

Booster circuit 310 may include two NMOS transistors, i.e., MN7 and MN8, coupled to shifter circuit 350. In the embodiment of FIG. 3B, MP1, MP2, MN1, MN2, MN5, MN6, MN7 and MN8 may be thick oxide transistors while MP3, MP4, MN3 and MN4 may be thin oxide transistors. In one embodiment, the transistors MP1-MP4 and MN1-MN6 in shifter circuit 350 may have different threshold voltages. In an exemplary embodiment, each of MN1, MN2, MN5 and MN6 may have a zero voltage threshold, while each of MN3, MN4, MP3 and MP4 may have a 0.25V voltage threshold and each of MP1 and MP2 may be a thick oxide transistor with a 0.45V voltage threshold.

Referring still to FIG. 3B, two inverter circuits 356A and 356B may be coupled to input terminal 302. It should be appreciated that the first inverter, 356A, inverts input signals received at input terminal 302 and the second inverter, 356B, inverts the inverted version of the input signals from inverter 356A. In one embodiment, the output of inverter 356A provides an inverted version of the input signal received at input terminal 302 while the output of inverter 356B provides a buffered version of the input signal received at input terminal 302. It should be appreciated that, in shifter circuit 350, transistors MP1, MN2 and MN4 and MP2, MN1 and MN3 may form two inverters in a cross-coupled configuration. One side of the cross-coupled circuit may provide one output and another side may provide another output as a complementary output. In the embodiment of FIG. 3B, the first side or first connection of the cross-coupled circuit in level shifter circuit 350 is coupled to receive an inverted version of the input signals from the output of inverter 356A and the second side or the second connection is coupled to receive a buffered version of the input signals from the output of inverter 356B.

Referring still to FIG. 3B, the source-drain terminals of transistors MP1 and MP2 are coupled to voltage level 352, i.e., VCCIO, and the source-drain terminals of transistors MN3 and MN4 are coupled to another voltage level 354, i.e., GND. The gate of transistor MP1 is coupled to a source-drain terminal of transistor MN2 and the gate of transistor MP2 is coupled a source-drain terminal of transistor MN1. The gates of transistors MN1 and MN3 are coupled to receive the buffered input signals from the output of inverter 356B while the gates of transistors MN2 and MN4 are coupled to receive the inverted version of the input signals from the output of inverter 356A. Transistor MN1 is coupled in series to transistor MN3 and transistor MN2 is coupled in series to transistor MN4. In one embodiment, stacking up MN1 and MN3 and MN2 and MN4 may improve the pull down voltage overdrive at the output 312 of the shifter circuit. In one instance, the input voltage at input terminal 302 is at 0.85V and having extra transistors MN3 and MN4 may reduce the voltage overdrive from 0.85V to 0.6V (assuming each of transistors MN3 and MN4 has a threshold voltage of 0.25V), thereby improving the falling edge speed of the output signal at output terminal 312.

Referring still to FIG. 3B, on the pull-up side of shifter circuit 350, transistors MP3 and MN5 are coupled together in series and transistors MP4 and MN6 are coupled together in series. In the embodiment of FIG. 3B, the source of transistors MP3 and MP4 are coupled to voltage level 353, e.g., VCC. In one embodiment, voltage level 352, i.e., VCCIO, is greater than voltage level 353, i.e., VCC. In an exemplary embodiment, voltage level 352, VCCIO, may be 1.2V or more and voltage level 353, VCC, may be 0.85V. The gate of transistor MP3 is coupled to receive the buffered input signal from the output of inverter 356B while the gate of transistor MP4 is coupled to receive the inverted input signal from the output of inverter 356A. The gate of transistor MN5 is coupled to receive the inverted input signal while the gate of transistor MN6 is coupled to receive the buffered input signal.

In the embodiment of FIG. 3B, booster circuit 310 may include two transistors MN7 and MN8 coupled to shifter circuit 350. The first source-drain terminal of transistor MN7 is coupled to the buffered input signal from the output of inverter 356B and the first source-drain terminal of transistor MN8 is coupled to the inverted input signal from the output of inverter 356A. The gate of transistor MN8 is coupled to the first side or the output 312 of shifter circuit 350 while the gate of transistor MN7 is coupled to the second side or a complementary output 314 of shifter circuit 350. The second source-drain terminal of transistor MN7 is coupled to the output 312 of shifter circuit 350 and the second source-drain terminal of transistor MN8 is coupled to the complementary output 314 of shifter circuit 350. In one embodiment, booster circuit 310 is operable to improve the switching speed of the level shifter circuit 350.

When the input signal at input 302 is at a low voltage level, e.g., 0V, transistors MN2 and MN4, coupled to receive an inverted version of the input signal, are turned on and transistor MP4 is turned off by transistor MN6. In this case, transistors MN2 and MN4 only need to overcome the strength of transistor MP2 to pull output signal at output terminal 312 to 0V. As the gate of each of transistors MN1 and MN3 is coupled to receive the buffered input signal, when the input signal is at a low voltage level, transistors MN1 and MN3 are turned off. Transistors MP1, MP3 and MN5 are turned on and the complementary output 314 of shifter circuit 350 is pulled to a voltage high level, e.g., Vccio at 0.85V, 1.5V, etc. As the gate of transistor MN7 is coupled to the complementary output 314 of shifter circuit 350, the gate of transistor MN7 is also at the voltage high level and transistor MN7 is turned on. A first source-drain terminal of transistor MN7 is coupled to receive the buffered input signal from inverter 356B and a second source-drain terminal of transistor MN7 is coupled to the output 312 of shifter circuit 350. As such, when the input signal is at a low voltage level, e.g., 0v, both the first and second source-drain terminals of transistor MN7 will also be at a low voltage level. As the gate of transistor MN8 is coupled to output 312 of shifter circuit 350, transistor MN8 is turned off when the output 312 is pulled to a low voltage level.

As the input signal at input terminal 302 switches from a low voltage level to a higher voltage level, e.g., from 0V to 0.85V, the first source-drain terminal of transistor MN7 switches from the low voltage level to the higher voltage level. As the gate of transistor MN7 is at a positive voltage level, the second source-drain terminal of transistor MN7 will be pulled to the higher voltage level too as the first source-drain terminal switches to the higher voltage level. In one embodiment, as the source terminal of transistor MN7 pulls the source-drain terminal that is coupled to output 312 to a higher voltage level, transistor MN7 may effectively boost the output signal at output 312 when the input signal is transitioning from a low voltage level to a high voltage level.

After shifter circuit 350 switches state from a low voltage level to a higher voltage level, the gate of transistor MN7 will be turned off while the gate of transistor MN8 will be turned on. When the input signal is at a high voltage level, transistors MN2 and MN4 are turned off while transistors MN1 and MN3 are turned on. Transistors MP2, MP4 and MN6 are turned on and output 312 of shifter circuit 350 is pulled to the high voltage level, e.g., Vccio at 1.5V or greater. As the gate of each of transistors MN1 and MN3 is coupled to receive the buffered input signal, when the input signal is at a high voltage level, transistors MN1 and MN3 are turned on. Transistors MP1, MP3 and MN5 are turned off and the complementary output 314 of shifter circuit 350 is pulled to a voltage low level, e.g., 0V. A first source-drain terminal of transistor MN8 is coupled to receive the inverted input signal from inverter 356A and a second source-drain terminal of transistor MN8 is coupled to the complementary output 314 of shifter circuit 350. As such, when the input signal is at a high voltage level, e.g., 0.85v, both the first and second source-drain terminals of transistor MN8 will be at a low voltage level.

When the input signal at input terminal 302 switches from a higher voltage level to a low voltage level, e.g., from 0.85V back to 0V, the first source-drain terminal of transistor MN8 switches from the low voltage level to the higher voltage level. As the gate of transistor MN8 is now at a positive voltage level, the second source-drain terminal of transistor MN8 will be pulled to the higher voltage level too as the first source-drain terminal switches to the higher voltage level. In one embodiment, as the source terminal of transistor MN8 pulls the drain terminal that is coupled to output 312 to a higher voltage level, transistor MN8 may effectively boost the complementary output 314 of shifter circuit 350 when the input signal is transitioning from high voltage level to a low voltage level. The boost provided by transistor MN8 may provide a downward kick to output 312 by turning off transistor MP2 faster than if transistor MN8 were not present. In an exemplary embodiment, as transistor MN7 is turned off when the input signal is transitioning from a high voltage level to a low voltage level, transistor MN7 may not affect the falling edge of the output signal at output 312 of shifter circuit 350.

Figure 4:
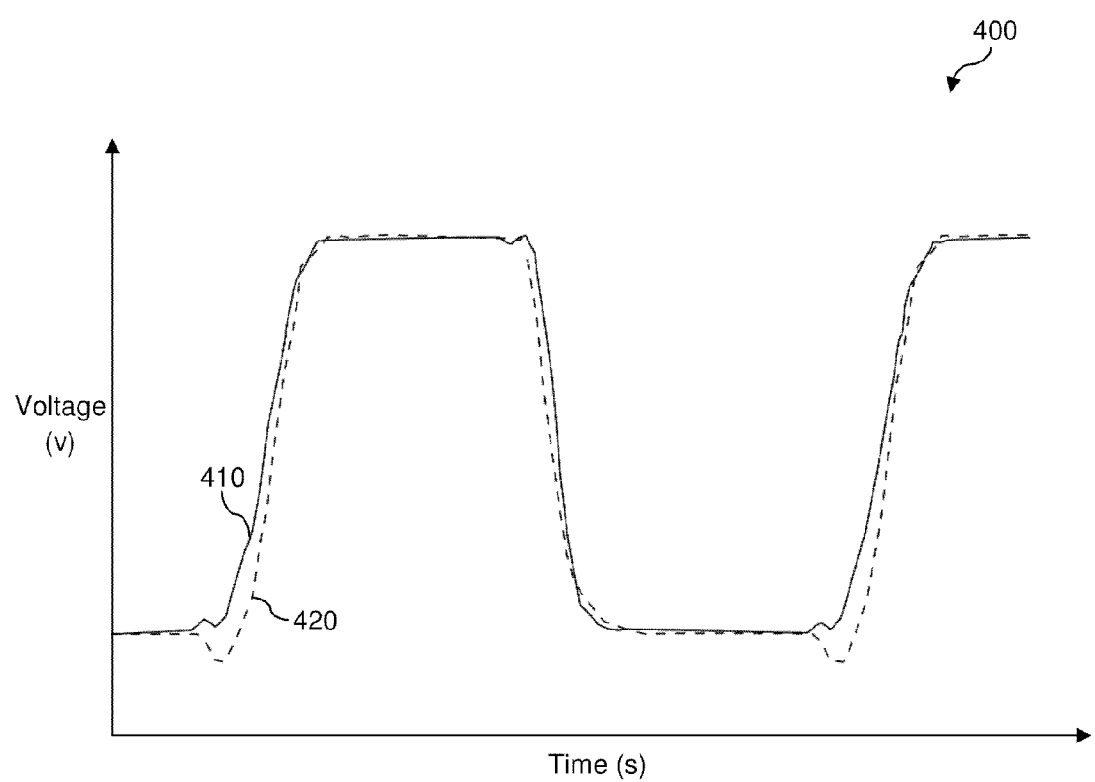
FIG. 4 is a graph of voltage over time with exemplary waveforms representing output signals with and without a booster circuit respectively in accordance with an embodiment of the present invention.

FIG. 4, meant to be illustrative and not limiting, shows graph 400 of voltage over time with exemplary waveforms 410 and 420 representing output signals with and without a booster circuit respectively. In one embodiment, waveform 410 represents an output signal from a level shifter circuit with a booster or kicker circuit similar to the level shifter circuit 230 of FIGS. 3A and 3B and waveform 420 represents an output signal from a level shifter circuit without a booster circuit. It should be appreciated that waveforms 410 and 420 illustrate at least a single complete cycle of an output signal with a rising edge and a falling edge. In the embodiment of FIG. 4, the rising edge of the output signal, represented by waveform 410, is boosted or enhanced compared to the rising edge of the output signal represented by waveform 420. In other words, the output signal, as shown by waveform 410, switches to a relatively higher voltage in a shorter amount of time compared to the output signal from a level shifter circuit without a booster circuit, as shown by waveform 420. In an exemplary embodiment, the rising edge of the output signal is relatively slower than the falling edge of the output signal. In one embodiment, the rising edge of waveform 410 shows a transition of a signal from a low voltage level to a high voltage level, e.g., 0V to 1.5V, in level shifter circuit 230 in FIGS. 3A and 3B.

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A level shifter comprising:
   input and output terminals, wherein the level shifter is operable to shift an input signal that ranges from a ground voltage to a first positive voltage to an output signal that ranges from the ground voltage to a second positive voltage that is greater than the first positive voltage;
   a first kicker transistor having a first source-drain terminal operable to receive a buffered version of the input signal and having a second source-drain terminal coupled to the output terminal, wherein the first kicker transistor is operable to receive a gate signal that turns on the first kicker transistor when the input signal is at the ground voltage and wherein, as the input signal transitions from the ground voltage to the first positive voltage, the first kicker transistor is operable to pull the output terminal at least up to the first positive voltage; and
   a shifter circuit coupled between the input and output terminals and operable to shift the input signal that ranges from the ground voltage to the first positive voltage to the output signal that ranges from the ground voltage to the second positive voltage that is greater than the first positive voltage, wherein the shifter circuit comprises at least a given transistor having a first thickness and wherein the first kicker transistor has a second thickness that is different from the first thickness.

2. The level shifter defined in claim 1 further comprising:
   a complementary input terminal operable to receive an inverted version of the input signal;
   a complementary output terminal operable to provide an inverted version of the output signal; and
   a second kicker transistor having a first source-drain terminal operable to receive the inverted version of the input signal and having a second source-drain terminal coupled to the complementary output terminal, wherein the second kicker transistor is operable to receive a gate signal that turns on the second kicker transistor when the input signal is at the first positive voltage and wherein, as the input signal transitions from the first positive voltage to the ground voltage, the second kicker transistor is operable to pull the complementary output terminal at least up to the first positive voltage.

3. The level shifter defined in claim 2 further comprising:
   a first inverter operable to receive the input signal, having an output, and operable to produce the inverted version of the input signal at the output, wherein the first source-drain terminal of the first kicker transistor is coupled to the output of the first inverter; and
   a second inverter operable to receive the inverted version of the input signal, having an output, and operable to produce the buffered version of the input signal at the output, wherein the first source-drain terminal of the second kicker transistor is coupled to the output of the second inverter.

4. The level shifter defined in claim 3 wherein the first kicker transistor comprises an n-channel transistor and wherein the second kicker transistor comprises an n-channel transistor.

5. The level shifter defined in claim 4 further comprising:
   a first p-channel transistor coupled between a first positive power supply line at the second positive voltage and the complementary output terminal, wherein the first p-channel transistor has a gate terminal coupled to the output terminal; and
   a second p-channel transistor coupled between the first positive power supply line and the output terminal, wherein the second p-channel transistor has a gate terminal coupled to the complementary output terminal.

6. The level shifter defined in claim 5 further comprising:
   first, second, third, and fourth n-channel transistors, wherein:
   the first and third n-channel transistors are coupled in series between a ground power supply line at the ground voltage and the complementary output terminal;
   the first and third n-channel transistors each has a gate terminal coupled to the output of the second inverter;
   the second and fourth n-channel transistors are coupled in series between the ground power supply line and the output terminal; and
   the second and fourth n-channel transistors each has a gate terminal coupled to the output of the first inverter.

7. The level shifter defined in claim 6 further comprising:
   a third p-channel transistor and a fifth re-channel transistor coupled together in series between a second positive power supply line at the first positive voltage and the complementary output terminal, wherein the third p-channel transistor has a gate terminal coupled to the output of the second inverter and wherein the fifth n-channel transistor has a gate terminal coupled to the output of the first inverter.

8. The level shifter defined in claim 7 further comprising:
   a fourth p-channel transistor and a sixth re-channel transistor coupled together in series between the second positive power supply line and the output terminal, wherein the fourth p-channel transistor has a gate terminal coupled to the output of the first inverter and wherein the sixth n-channel transistor has a gate terminal coupled to the output of the second inverter.

9. The level shifter defined in claim 8 wherein the first and second kicker transistors, the first and second p-channel transistors, and the first, second, fifth, and sixth n-channel transistors each comprises a thick oxide transistor having a first threshold voltage and wherein the third and fourth n-channel transistors and the third and fourth p-channel transistors each comprises a thin oxide transistor having a second threshold voltage that is less than the first threshold voltage.

10. The level shifter defined in claim 1 wherein the second thickness is greater than the first thickness.

11. A circuit comprising:
    a first circuit having an input and an output, the first circuit comprising a first inverter and a second inverter having a first connection and a second connection to each other, wherein each of the first and second inverters comprises a p-channel metal-oxide-semiconductor field-effect (PMOS) transistor coupled to a first n-channel metal-oxide-semiconductor field-effect (NMOS) transistor and a second NMOS transistor; and
    a second circuit having a first transistor with a gate coupled to the first connection, a first source-drain terminal coupled to the input and a second source-drain terminal coupled to the second connection, wherein the first transistor is operable to enhance a first edge of an output signal at the output when an input signal at the input switches from a first state to a second state.

12. The circuit of claim 10, wherein the first and second NMOS transistors are coupled in series and wherein a thickness of a gate of the first transistor is different from a thickness of a gate of the second transistor.

13. The circuit of claim 11, wherein the second circuit further comprises a second transistor having a gate coupled to the second connection, a first source-gate terminal coupled to the input and a second source-drain terminal coupled to the first connection, wherein the second transistor is operable to enhance a second edge of the output signal at the output when the input signal at the input switches from the second state to the first state.

14. The circuit of claim 13, wherein the first edge is a rising edge, the second edge is a falling edge, and wherein the first state is a first voltage level and the second state is a second voltage level, wherein the second voltage level is greater than the first voltage level.

15. The circuit of claim 11, further comprising a first inverter circuit coupled to the input, wherein the first inverter circuit is operable to output an inverted version of the input signal and a second inverter circuit coupled to the first inverter circuit, wherein the second inverter circuit is operable to further invert the inverted version of the input signal.

16. The circuit defined in claim 11 wherein the first transistor of the second circuit has a first thickness, wherein at least one of the p-channel metal-oxide-semiconductor field-effect (PMOS) transistors, the first n-channel metal-oxide-semiconductor field-effect (NMOS) transistors, and the second NMOS transistors has a second thickness, and wherein the first thickness is different from the second thickness.

17. The circuit defined in claim 16 wherein the first thickness is greater than the second thickness.

18. A circuit comprising:
an input terminal coupled to receive an input signal at a first logic level;
a shifter circuit coupled to receive the input signal, wherein the shifter circuit is operable to shift the input signal from a first voltage range to a second voltage range, and wherein the shifter circuit is further operable to transmit the shifted signal to an output terminal; and
a booster circuit coupled to receive the input signal, wherein the booster circuit is coupled to the shifter circuit, wherein the booster circuit is operable to improve the shifted signal at the output terminal when the input signal transitions from the first logic level to a second logic level, and wherein the booster circuit comprises a first thick oxide transistor.

19. The circuit of claim 18, wherein the shifter circuit comprises:
a pair of cross-coupled inverters coupled to each other forming a first connection and a second connection, wherein the output terminal is coupled to the first connection;
a first inverter circuit and a second inverter circuit coupled to the input terminal, wherein the first inverter circuit is operable to generate an inverted version of the input signal, and wherein the second inverter circuit is operable to invert the inverted version of the input signal to generate a buffered input signal.

20. The circuit of claim 19, wherein the first thick oxide transistor has a first source-drain terminal coupled to receive the buffered input signal, a second source-drain terminal coupled to the first connection and a gate coupled to the second connection, wherein the first thick oxide transistor is operable to boost a rising edge of the shifted signal at the output terminal when the input signal transitions from the first logic level to the second logic level, and wherein the booster circuit further comprises:
a second thick oxide transistor having a first source-drain terminal coupled to receive the inverted version of the input signal, a second source-drain terminal coupled to the second connection and a gate coupled to the first connection, wherein the second thick oxide transistor is operable to boost the rising edge of an inverted version of the shifted signal at the second connection.

21. The input-output circuit of claim 20, wherein the first and second transistors comprise n-channel metal-oxide-semiconductor field-effect (NMOS) transistors.

22. The circuit of claim 18, wherein the circuit is an input-output circuit on a programmable logic device (PLD), wherein the output terminal is an output pin of the PLD and wherein the circuit from which the input terminal receives the input signal is on the PLD.

* * * * *